(12) United States Patent
Yeh et al.

(10) Patent No.: US 12,039,905 B2
(45) Date of Patent: Jul. 16, 2024

(54) ELECTRONIC DEVICE

(71) Applicant: InnoLux Corporation, Miao-Li County (TW)

(72) Inventors: Chia-Min Yeh, Miao-Li County (TW); Hsieh-Li Chou, Miao-Li County (TW); Cheng-Tso Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/303,305

(22) Filed: Apr. 19, 2023

(65) Prior Publication Data

US 2023/0410705 A1 Dec. 21, 2023

Related U.S. Application Data

(60) Provisional application No. 63/343,712, filed on May 19, 2022.

(30) Foreign Application Priority Data

Feb. 14, 2023 (CN) .......................... 202310115290.3

(51) Int. Cl.
*G06F 3/041* (2006.01)
*G09G 3/00* (2006.01)
*H01L 27/12* (2006.01)

(52) U.S. Cl.
CPC ......... *G09G 3/006* (2013.01); *G09G 2330/12* (2013.01); *H01L 27/124* (2013.01)

(58) Field of Classification Search
None
See application file for complete search history.

(56) References Cited

U.S. PATENT DOCUMENTS

2010/0026656 A1* 2/2010 Hotelling .............. G06F 3/0446
345/174
2022/0206606 A1* 6/2022 Ye .......................... G06F 3/0443

FOREIGN PATENT DOCUMENTS

CN 103345436 A 10/2013

* cited by examiner

*Primary Examiner* — Carl Adams
(74) *Attorney, Agent, or Firm* — Muncy, Geissler, Olds & Lowe, P.C.

(57) ABSTRACT

An electronic device includes: a substrate, a signal line, a detection line and a detection unit. The substrate has a peripheral area and a substrate edge. The signal line is disposed on the substrate, and the signal line is located in the peripheral area. The detection line is disposed on the substrate, and is adjacent to the signal line. The detection unit is electrically connected to the detection line. Wherein, the detection line is disposed between the signal line and the substrate edge, and the detection line and the signal line are electrically insulated.

17 Claims, 11 Drawing Sheets

ELECTRONIC DEVICE

CROSS-REFERENCE TO RELATED APPLICATIONS

This application claims the benefit of filing date of U.S. Provisional Application Ser. No. 63/343,712 filed May 19, 2022 under 35 USC § 119(e)(1), and also claims the benefit of the Chinese Patent Application Serial Number 202310115290.3, filed on Feb. 14, 2023, the subject matter of which is incorporated herein by reference.

BACKGROUND

Field of the Disclosure

The present disclosure relates to an electronic device and, more particularly, to an electronic device capable of detecting abnormal signal lines.

Description of Related Art

The edge or inner surface of the electronic device may be damaged due to certain reasons, such as cutting during production or impact during use of the electronic device, resulting in scratches, cracks, chipping, etc. Since the current electronic devices are not provided with a mechanism for real-time detection of the yield rate of the signal line, it is only possible to determine whether the signal line is abnormal or not during the lighting test stage after the electronic device is assembled, which may cause inconvenience to manufacturers or users.

Therefore, there is a need for an electronic device to mitigate and/or obviate the aforementioned problems.

SUMMARY

The present disclosure provides an electronic device. The electronic device includes a substrate, a signal line, a detection line and a detection unit. The substrate has a peripheral area and a substrate edge. The signal line is arranged on the substrate and disposed in the peripheral area. The detection line is arranged on the substrate and adjacent to the signal line. The detection unit is electrically connected to the detection line. The detection line is disposed between the signal line and the substrate edge, and the detection line is electrically insulated from the signal line.

Other novel features of the disclosure will become more apparent from the following detailed description when taken in conjunction with the accompanying drawings.

DETAILED DESCRIPTION OF EMBODIMENT

Figure 1:
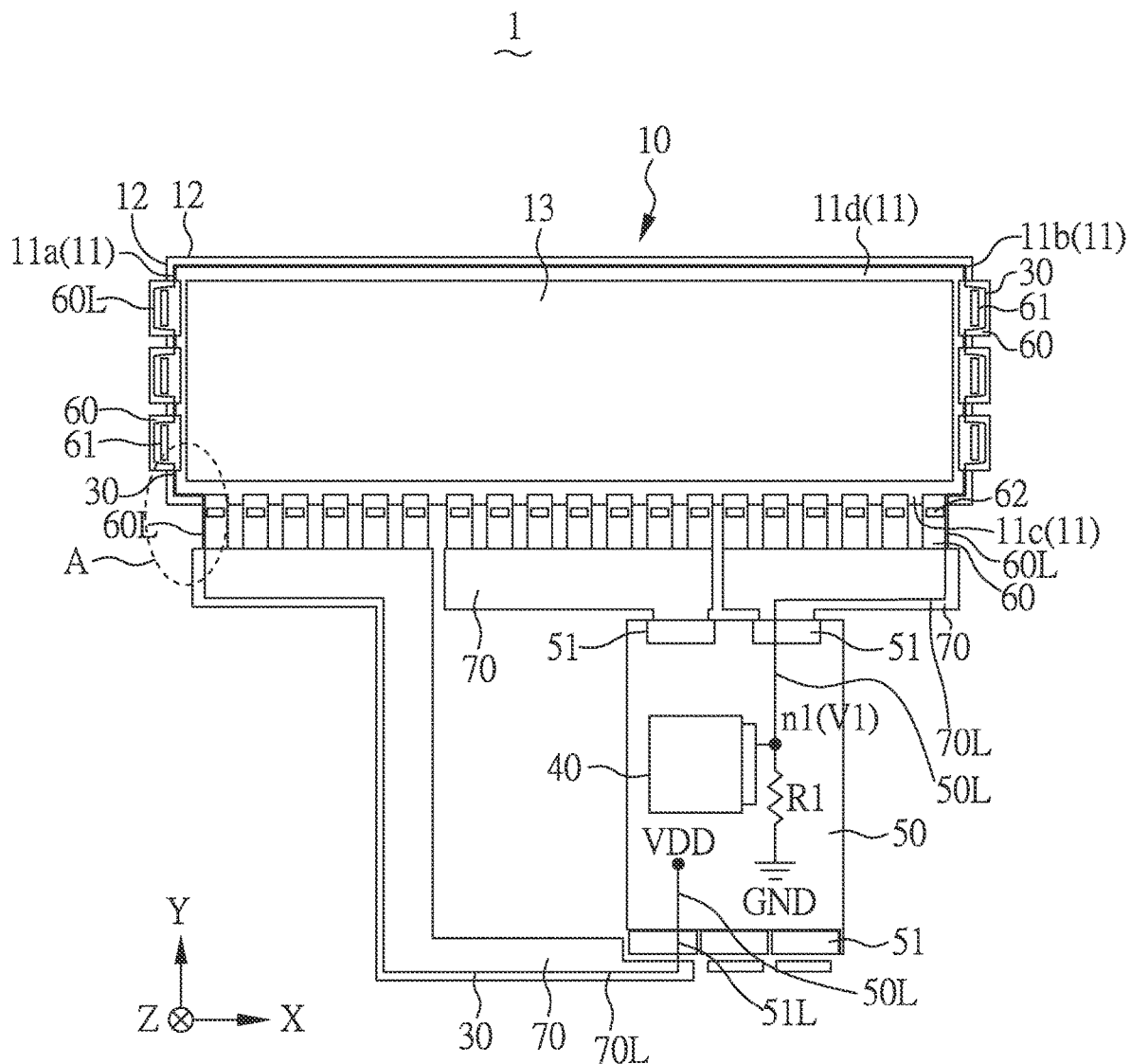
FIG. 1 is a schematic diagram of the electronic device according to an embodiment of the present disclosure.

Reference will now be made in detail to the exemplary embodiments of the present disclosure, examples of which are illustrated in the accompanying drawings. Wherever possible, the same reference numbers are used in the drawings and descriptions to refer to the same or like parts.

In the present disclosure, certain terms will be used throughout the specification and claims to refer to particular components. Those skilled in the art should understand that electronic device manufacturers may refer to the same component by different names. This article does not intend to distinguish between those components that have the same function but have different names. In the following description and claims, words such as "comprising", "including" and "containing" are open-ended words, so they should be interpreted as "including but not limited to".

The directional terms mentioned herein, such as "upper", "lower", "front", "rear", "left", "right", etc., are only referring to the directions of the accompanying drawings. Accordingly, the directional terms used are for illustration, not for limitation of the present disclosure. In the drawings, each figure illustrates the general characteristics of methods, structures and/or materials used in particular embodiments. However, these drawings should not be interpreted as defining or limiting the scope or nature encompassed by these embodiments. For example, the relative sizes, thicknesses and positions of layers, regions and/or structures may be reduced or enlarged for clarity.

A structure (or layer, component, substrate) described in the present disclosure is disposed on/over another structure (or layer, component, substrate), which may mean that the two structures are adjacent and directly connected, or may mean that the two structures are adjacent rather than directly connected. Indirect connection means that there is at least one intermediate structure (or intermediate layer, intermediate component, intermediate substrate, intermediate space) between two structures, the lower surface of one structure is adjacent to or directly connected to the upper surface of the intermediate structure, and the upper surface of the other structure is adjacent to or directly connected to the lower surface of the intermediate structure. The intermediate structure may be composed of a single-layer or multi-layer physical structure or a non-physical structure without limitation. In the present disclosure, when a certain structure is set "on" other structures, it may mean that a certain structure is "directly" on other structures, or that a certain structure is "indirectly" on other structures, that is, at least one structure is interposed between a certain structure and other structures. The terms "about", "equal", "equivalent", "same", "substantially" and "approximately" are generally interpreted as being within 20% of a given value or range, or as being within 10%, 5%, 3%, 2%, 1%, or 0.5% of a given value or range.

Moreover, any two values or directions used for comparison may have certain errors. If the first value is equal to the second value, it implies that there may be an error of about 10% between the first value and the second value; if the first direction is perpendicular or "approximately" perpendicular to the second direction, the angle between the first direction and the second direction may be between 80 degrees and 100 degrees; if the first direction is parallel or "substantially" parallel to the second direction, the angle between the first direction and the second direction may be between 0 degrees and 10 degrees.

The ordinal numbers used in the specification and claims, such as "first", "second", etc., are used to modify elements, which do not imply and represent that the element (or elements) has any previous ordinal numbers, and do not represent the order of a certain element with another element or the order of the manufacturing method. The use of the ordinal numbers is only to clearly distinguish the element with a certain name from another element with the same name. The claims and the description may not use the same term and, accordingly, the first component in the description may be the second component in the claim.

In the present disclosure, the expressions "the given range is from the first numerical value to the second numerical value" and "the given range falls within the range from the first numerical value to the second numerical value" indicate that the given range includes the first numerical value, the second value, and other values therebetween.

In addition, the method disclosed in this disclosure can be used in electronic devices, and electronic devices may include imaging devices, assembly devices, display devices, backlight devices, antenna devices, sensing devices, tiled devices, touch displays, curved displays or free shape displays, but not limited thereto. When the electronic device is an assembling device or a tiled device, the electronic device may include a grabbing mechanism, but not limited thereto. The electronic device may include, for example, liquid crystal, light emitting diode, fluorescence, phosphor, other suitable display media, or combinations thereof, but not limited thereto. The display device may be a non-self-luminous display device or a self-luminous display device. The antenna device may be a liquid crystal type antenna device or a non-liquid crystal type antenna device, and the sensing device may be a sensing device for sensing capacitance, light, thermal energy or ultrasonic waves, but not limited thereto. The tiled device may be, for example, a display tiled device or an antenna tiled device, but not limited thereto. It is noted that the electronic device may be any permutation and combination of the aforementioned, but not limited thereto. In addition, the electronic device may be a bendable or flexible electronic device. It is noted that the electronic device may be any permutation and combination of the aforementioned, but not limited thereto. In addition, the shape of the electronic device may be rectangular, circular, polygonal, shape with curved edges, or other suitable shapes. The electronic device may have peripheral systems such as a drive system, a control system, a light source system, a shelf system, etc. to support a display device, an antenna device or a tiled device.

It is noted that, in the following embodiments, without departing from the spirit of the present disclosure, the features in different embodiments may be replaced, reorganized, and mixed to complete other embodiments. As long as the features of the various embodiments do not violate or conflict the spirit of the invention, they may be mixed and matched arbitrarily.

Unless otherwise defined, all terms (including technical and scientific terms) used herein have the same meaning as commonly understood by those skilled in the art to which the present disclosure belongs. It can be understood that these terms, such as those defined in commonly used dictionaries, should be interpreted as having meanings consistent with the background or context of the related technology and the present disclosure, and should not be interpreted in an idealized or overly formal manner, unless otherwise specified in the embodiments of the present disclosure.

In addition, the term "adjacent" in the specification and claims is used to describe mutual proximity, and does not necessarily mean mutual contact.

In addition, the description of "when . . . " or "while . . . " in the present disclosure means "now, before, or after", etc., and is not limited to occurrence at the same time. In the present disclosure, the similar description of "disposed on" or the like refers to the corresponding positional relationship between the two elements, and does not limit whether there is contact between the two elements, unless specifically limited. Furthermore, when the present disclosure recites multiple effects, if the word "or" is used between the effects, it means that the effects can exist independently, but it does not exclude that multiple effects can exist at the same time.

In addition, the term such as "connect" or "couple" in the specification and claims not only refer to direct connection with another element, but also refer to indirect connection or electrical connection with another element. In addition, the electrical connection includes direct connection, indirect connection or communication between two components by radio signals.

For the convenience of description, the electronic device will be described below as a display device, but the present disclosure is not limited thereto.

Figure 2:
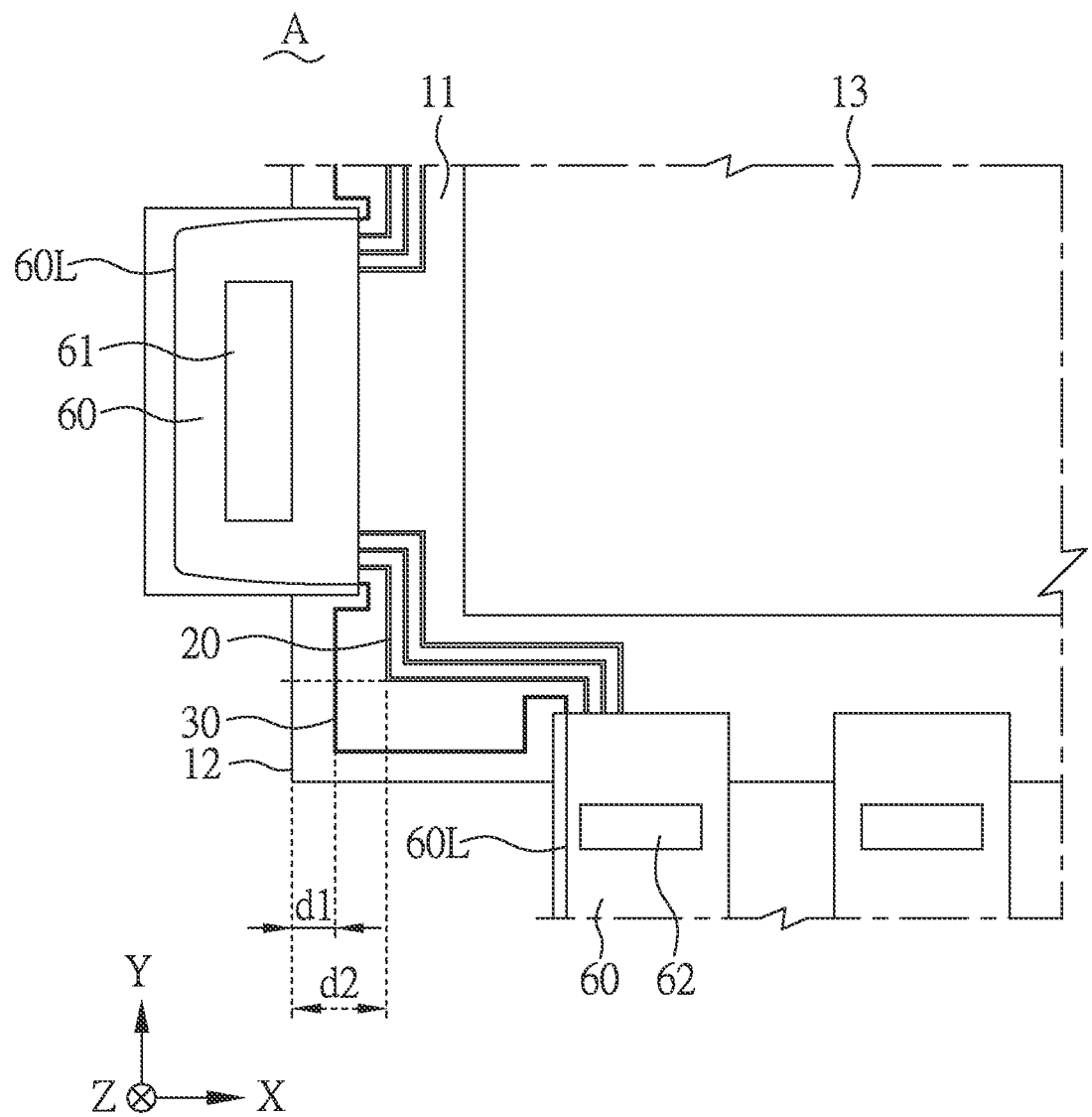
FIG. 2 is an enlarged view illustrating the area A of the electronic device of FIG. 1 according to an embodiment of the present disclosure.
Figure 3:
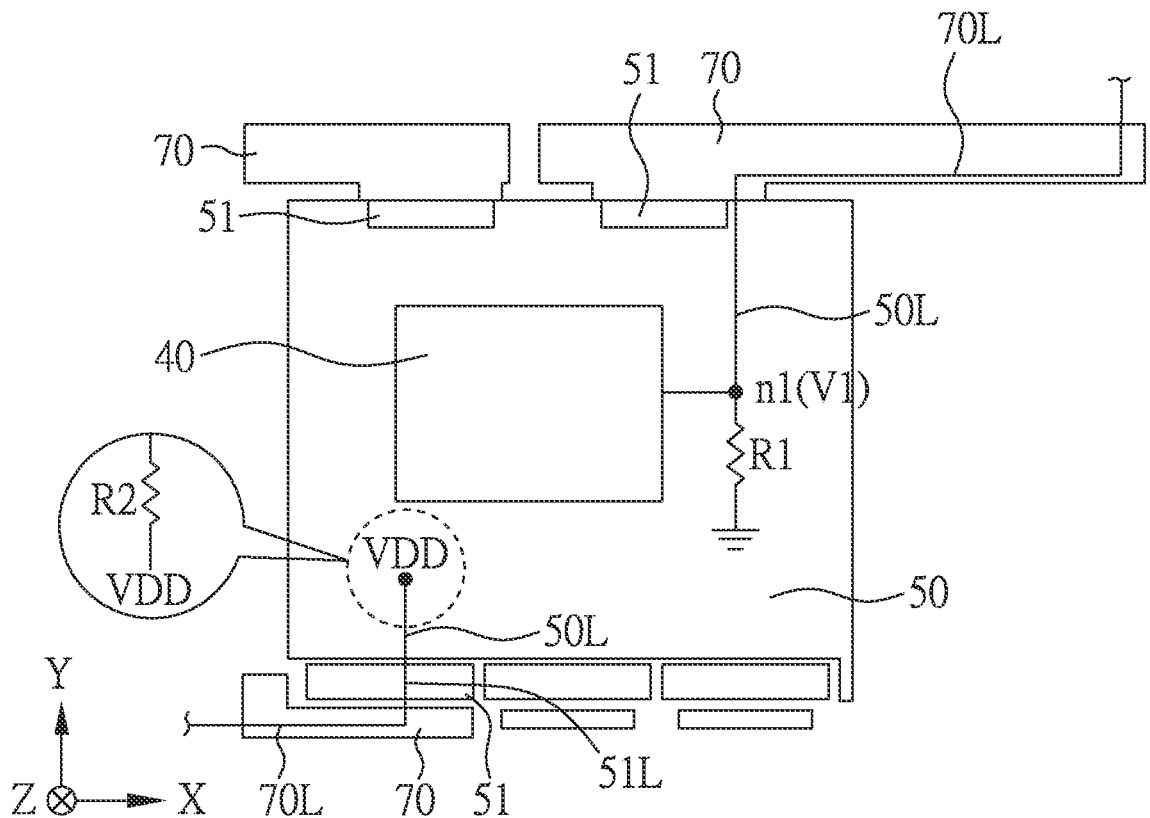
FIG. 3 is a schematic diagram of a detection unit according to an embodiment of the present disclosure.

FIG. 1 is a schematic diagram of the electronic device 1 according to an embodiment of the present disclosure. FIG. 2 is an enlarged view illustrating the area A of the electronic device 1 of FIG. 1. FIG. 3 is a schematic diagram of a detection unit 40 according to an embodiment of the present disclosure.

As shown in FIG. 1 and FIG. 2, the electronic device 1 includes a substrate 10, at least one signal line 20 (shown in FIG. 2), a detection line 30 and a detection unit 40. The substrate 10 has a peripheral area 11 and a substrate edge 12. The contour of the substrate edge 12 is substantially the contour of the outer edge of the peripheral area 11 of the substrate 10, but it is not limited thereto. The signal line 20 is arranged on the substrate 10, and is disposed in the peripheral area 11. The detection line 30 is arranged on the substrate 10 (such as the peripheral area 11), and is adjacent to the signal line 20. The detection unit 40 is electrically connected to the detection line 30. The detection line 30 is disposed between the signal line 20 and the substrate edge 12, and the detection line 30 is electrically insulated from the signal line 20. In one embodiment, the electronic device 1 further includes a circuit board 50 electrically connected to the substrate 10, and the detection unit 40 is arranged on the circuit board 50. It is noted that the quantities of the aforementioned components shown in the figures are only examples but not limitations.

First, the substrate 10 is described. The substrate 10 may further include an active area 13. The peripheral area 11 is adjacent to the active area 13. The active area 13 may be, for example, a display area, a detection area or other application areas. The active area 13 may be substantially defined, for example, as the area covered by all pixel units PX (with reference to FIG. 11) or detection units. In some embodiments, the substrate 10 is, for example, an array substrate, which may include a plurality of scan lines 22 (with reference to FIG. 11) and a plurality of data lines 21 (with reference to FIG. 11), which may be, for example, interlaced with each other and electrically connected to the pixel units PX (or the detection units), while the present disclosure is not limited thereto. The peripheral area 11, for example, is disposed on at least one side of the active area 13 or surrounds the active area 13. The peripheral area 11 may have a first portion 11a, a second portion 11b, a third portion 11c and/or a fourth portion 11d, wherein the first portion 11a is, for example, opposite to the second portion 11b, the third portion 11c is, for example, opposite to the fourth portion 11c, and the first portion 11a and the second portion 11b are each connected between the third portion 11c and the fourth portion 11d, but it is not limited thereto. The shape of the substrate 10 is rectangular, for example, but it is not limited thereto. The substrate 10 may be designed in different shapes according to the requirements, and the shape of the contour of the active area 13 is not limited to a rectangle, and different shapes may be designed according to the requirements.

In some embodiments, at least one scan driver 61 is electrically connected to a plurality of scan lines (not shown), and at least one data driver 62 is electrically connected to a plurality of data lines (not shown). The at least one scan driver 61 and at least one data driver 62 may be, for example, arranged on or bonded to the peripheral area 11 of the substrate 10, and the at least one scan driver 61 and at least one data driver 62 may be, for example, arranged on or bonded to different sides of the peripheral area 11. In one embodiment, the scan driver 61 and/or the data driver 62 may be, for example, arranged on or bonded to the peripheral area 11 through a chip on film (COF) method. The scan driver 61 and the data driver 62 are each arranged on a conductive film 60, for example, while one end of the conductive film 60 may be bonded to the peripheral area 11, and the other end of the conductive film 60 is bonded to the circuit board 50, so that the circuit board 50 is electrically connected to the scan driver 61 and/or the data driver 62, but it is not limited thereto. In other embodiments, the scan driver 61 and/or the data driver 62 may be arranged or bonded on the peripheral area 11 through a chip on glass (COG) packaging or other methods, and electrically connected to a plurality of scan lines or a plurality of data lines. For the convenience of description, the description below will be made in the form of a chip on film, but it is not limited thereto. In some embodiments, a timing controller and/or a microcontroller may be arranged on the circuit board 50, but it is not limited thereto. The timing controller or microcontroller may be electrically connected to the scan driver 61 and the data driver 62, for example, while it is not limited thereto. In one embodiment, a plurality of scan drivers 61 may be arranged adjacent to the first portion 11a and/or second portion 11b of the peripheral area 11, and a plurality of data drivers 62 may be arranged adjacent to the third portion 11c of the peripheral area 11, but it is not limited thereto. The scan driver 61 and the data driver 62 may be disposed at different positions of the substrate according to the actual requirements.

Next, the signal line 20 is described. As shown in FIG. 1 and FIG. 2, the signal line 20 may be electrically connected, for example, between different scan drivers 61, between different data drivers 62, or between the scan driver 61 and the data driver 62. Through the signal line 20, electrical connection between different scan drivers 61, between different data drivers 62, or between scan drivers 61 and data drivers 62 may be achieved, but it is not limited thereto. In one embodiment, the signal line 20 may be disposed on different components according to the design.

Next, the detection line 30 is described. As shown in FIG. 1 and FIG. 3, one end of the detection line 30 may be electrically connected to an external voltage VDD, and the other end of the detection line 30 may be electrically connected to a fixed voltage GND, while the voltage difference between the external voltage VDD and the fixed voltage GND is greater than 0. In one embodiment, the fixed voltage GND may be electrically connected to the detection line 30 through an external resistor R1. In one embodiment, the external voltage VDD may be electrically connected to the detection line 30 through a second external resistor R2. In one embodiment, the fixed voltage GND may be a low voltage level or a ground voltage level, such as grounding, and the external voltage VDD may be a high voltage level, but it is not limited thereto. In one embodiment, the external resistor R1 or the second external resistor R2 may be arranged on the circuit board 50 or other components, but it is not limited thereto. In one embodiment, the source end of the external voltage VDD and/or the source end of the fixed voltage GND may be disposed on the circuit board 50, but it is not limited thereto.

In one embodiment, the detection line 30 may be electrically connected to the connection lines disposed on different components, so that the detection line 30 is electrically connected to the detection unit 40. Examples of the connection lines disposed on different components include the connection line 60L disposed on the conductive film the connection line 70L disposed on the flexible circuit board 70, the connection line 51L disposed on the connector 51 and/or the connection line 50L disposed on the circuit board 50, while it is not limited thereto. In one embodiment, for example, the connection line 60L does not overlap with the scan driver 61 and/or the data driver 62. In one embodiment (not shown), if the scan driver 61 or the data driver 62 has a branch circuit (not shown) electrically insulated from the signal line 20, the connection line 60L may also be electrically connected to the branch circuit, while it is not limited thereto.

In addition, as shown in FIG. 1 and FIG. 2, the detection line 30 may be arranged on the first portion 11a, the fourth portion 11d and the second portion 11b of the peripheral area 11.

As shown in FIG. 2, in one embodiment, in the direction parallel to the width of the detection line 30, the detection line 30 and the substrate edge 12 are separated by, for example, a first distance d1, and the signal line 20 and the substrate edge 12 are separated by, for example, a second distance d2, wherein the first distance d1 is smaller than the second distance d2 (that is, d1<d2). It is noted that, for example, the first distance d1 and the second distance d2 are measured in the same direction (such as the X direction or the Y direction), and the measurement positions of the first distance d1 and the second distance d2 are, for example, along the same virtual line (as shown in dotted line in FIG. 2). In one embodiment, the first distance d1 is, for example, greater than or equal to 50 micrometers (um), and smaller than the second distance d2 (i.e., 50 um≤d1<d2), but it is not limited thereto. In one embodiment, the first distance d1 is, for example, greater than or equal to 100 micrometers and smaller than the second distance d2 (i.e., 100 um≤d1<d2), but it is not limited thereto. In one embodiment, the first distance d1 is, for example, greater than or equal to 350 micrometers and smaller than the second distance d2 (i.e., 350 um≤d1<d2), but it is not limited thereto. In one embodiment, the first distance d1 is, for example, greater than or equal to 500 micrometers and smaller than the second distance d2 (i.e., 500 um≤d1<d2), but it is not limited thereto. In one embodiment, in a direction parallel to the width of the detection line 30, the distance (d2−d1) between the detection line 30 and the signal line 20 may be, for example, between 10 to 30 microns (that is, 10 um≤(d2−d1)≤30 um), such as about 20 microns, but it is not limited thereto. In one embodiment, in a direction parallel to the width of the detection line 30, the distance (d2−d1) between the detection line 30 and the signal line 20 may be between 10 to 40 microns (i/e., 10 um≤(d2−d1)≤40 um), while it is not limited thereto. In one embodiment, in a direction parallel to the width of the detection line 30, the distance (d2−d1) between the detection line 30 and the signal line 20 may be between 10 to 50 microns (i.e., 10 um≤(d2−d1)≤50 um), while it is not limited thereto.

Next, the detection unit 40 will be described. As shown in FIG. 1 and FIG. 3, the detection unit 40 may be electrically connected to a node n1, wherein an external resistor R1 is electrically connected between the fixed voltage GND and the node n1. The detection unit 40 may be used to detect the voltage V1 on the node n1. The detection unit may be disposed on the circuit board 50, but it is not limited thereto. In other embodiments (not shown), the detection unit 40 may be disposed on other positions, such as on the substrate 10 or the conductive film 60. Alternatively, the detection unit 40 may be integrated with a controller, a chip or other similar components, while it is not limited thereto. In one embodiment, the circuit board 50 may be electrically connected to the connector 51, the circuit board 50 is electrically connected to the flexible circuit board 70 through the connector 51, and the flexible circuit board 70 may be electrically connected to the conductive film 60 (on which the data driver 62 is provided) through bonding, but it is not limited thereto.

With the above configuration, the detection unit 40 may be used to detect the voltage V1 on the node n1. When the voltage V1 on the node n1 is not within the normal range, it indicates that the detection line 30 electrically connected to the node n1 may be abnormal (such as short circuit or disconnection), so as to infer that the signal line 20 adjacent to the detection line 30 may also become abnormal, thereby detecting abnormalities of the signal line 20 in time. Specifically, when the detection line 30 is abnormal, it indicates that the signal line 20 adjacent to the detection line 30 is likely to be damaged. By using the detection line 40 to detect the voltage V1 on the node n1, it is able to infer whether the signal line 20 is abnormal or not through determining the abnormal condition of the detection line 30.

Figure 4:
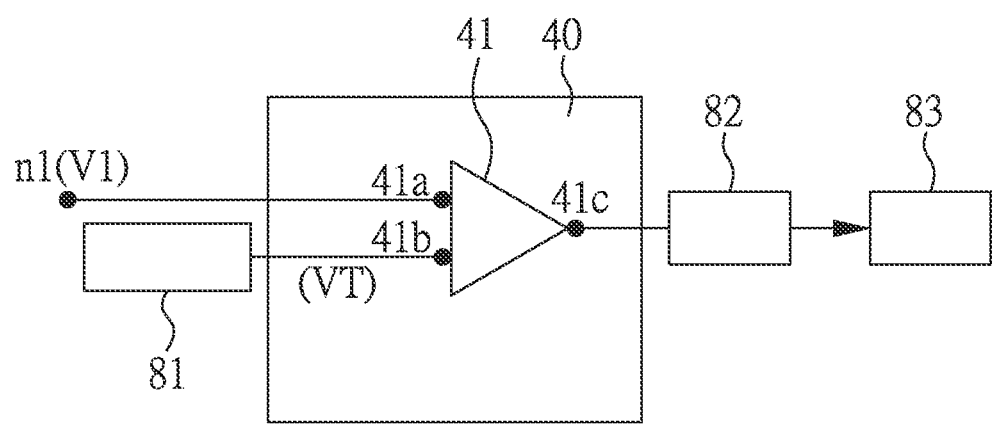
FIG. 4 is a schematic diagram illustrating the internal structure of the detection unit according to an embodiment of the present disclosure.

Next, the detailed features of the detection unit 40 will be described, and please refer to FIG. 1 to FIG. 4 at the same time, wherein FIG. 4 is a schematic diagram of the internal structure of the detection unit 40 according to an embodiment of the present disclosure.

As shown in FIG. 4, the detection unit 40 may include a comparator 41, but it is not limited thereto. In one embodiment, the comparator 41 may have a first end 41a, a second end 41b and a third end 41c, wherein the first end 41a and the second end 41b may be receiving ends, and the third end 41c may be an output end. The first end 41a of the comparator 41 may be electrically connected to the node n1, the second end 41b of the comparator 41 may be electrically connected to a register 81, and the third end 41c of the comparator 41 may be electrically connected to a micro control unit (MCU) 82, but it is not limited thereto. The micro control unit 82 may be electrically connected to an electronic control unit (ECU) 83, but it is not limited thereto. In one embodiment, the register 81, the micro control unit 82 or the electronic control unit 83 may be arranged on the circuit board 50, but it is not limited thereto, while the register 81, the micro control unit 82 or the electronic control unit 83 may also be arranged on other components of the electronic device 1, or may also be arranged outside the electronic device 1, as long as it is reasonably feasible. In one embodiment, the detection unit 40 may be integrated into the scan driver 61, the data driver 62 or the micro control unit 82, while it is not limited thereto.

In other words, one end of the comparator 41 (for example, the first end 41a) is electrically connected to the detection line 30, and the other end of the comparator 41 (for example, the second end 41b) is electrically connected to a register 81, while the register 81 is used for storing a configured voltage VT. The first end 41a of the comparator 41 may receive the voltage V1 on the node n1, and the second end 41b of the comparator 41 may receive the configured voltage VT stored in the register 81, wherein the configured voltage VT may include a specific voltage or a voltage range, and the configured voltage VT may be regarded as a normal value or a normal value range of the voltage V1 on the node n1. Accordingly, the comparator 41 may compare the voltage V1 on the node n1 with the configured voltage VT, and transmit the comparison result to the micro control unit 82. When the voltage V1 on the node n1 is close to the configured voltage VT or is within the voltage range of the configured voltage VT, the micro control unit 82 may determine that the wiring path of the detection line 30 is normal. At this moment, the signal line 20 adjacent to the detection line 30 may not encounter abnormalities due to the cutting of the process, but it is not limited thereto. When the difference between the voltage V1 on the node n1 and the configured voltage VT is too large or the voltage V1 is not within the voltage range of the configured voltage VT, the micro control unit 82 may determine that the wiring path of the detection line 30 becomes abnormal. The signal line 20 may also become abnormal. In one embodiment, the voltage V1 on the node may be expressed as follows:

$$V1=(VDD-GND)\times[R1/(R1+RW+R2)],$$

where V1 is the voltage on the node n1, VDD is the voltage provided by the external voltage VDD, GND is a fixed voltage (which may be a low voltage or a ground voltage), R1 is an external resistor electrically connected between the fixed voltage GND and the node n1, RW is the overall resistance of the detection line 30 under normal conditions that may be determined in advance according to the design of the detection line 30 (such as length and width), and R2 is an external resistor electrically connected between the external voltage VDD and the detection line 30s.

Figure 5:
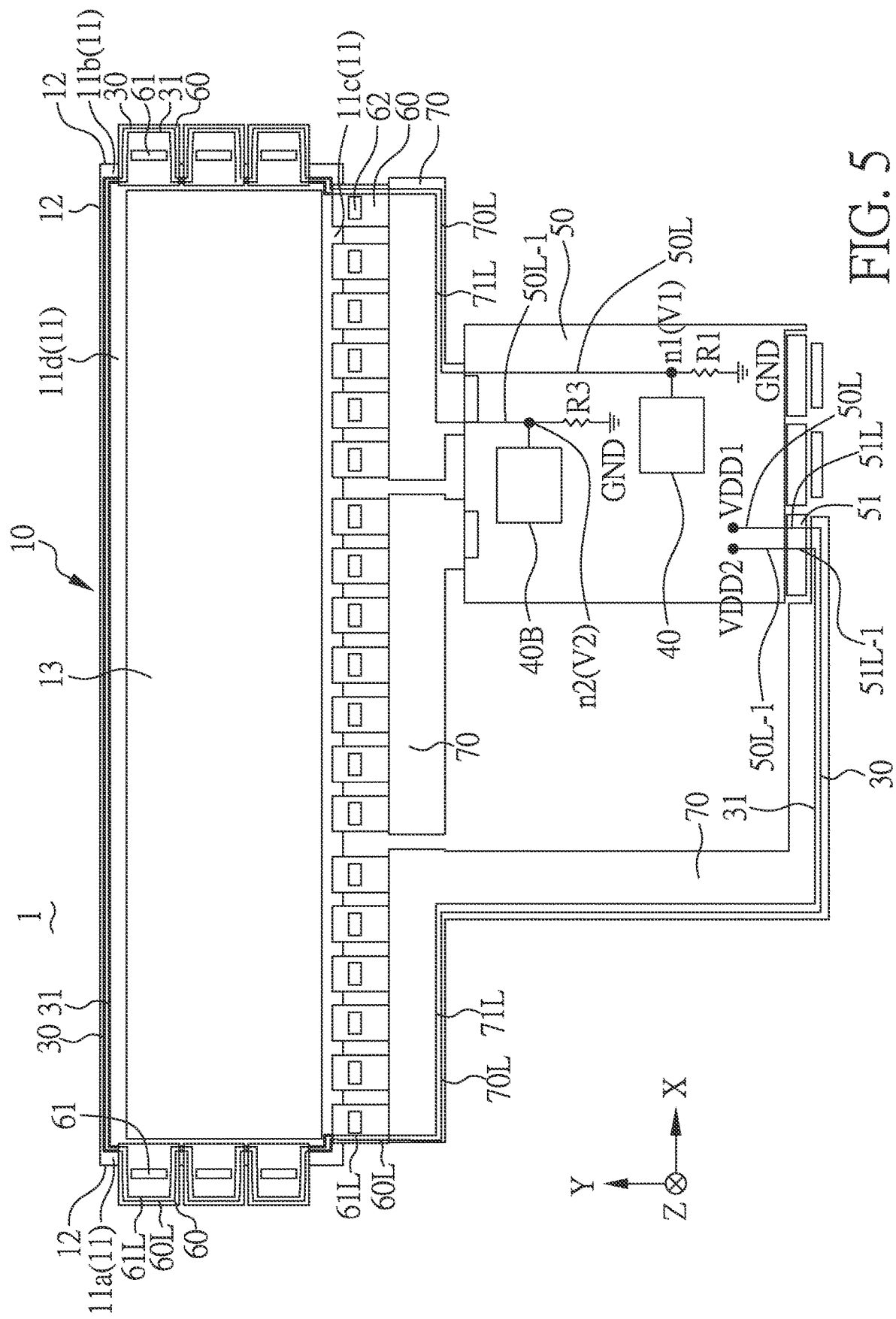
FIG. 5 is a schematic diagram of the electronic device according to another embodiment of the present disclosure.

In one embodiment, when the detection line 30 is damaged, its resistance RW may be abnormal (for example, the resistance increases), and thus the voltage V1 on the node n1 may become abnormally small. At this moment, the difference between the voltage V1 on the node n1 and the configured voltage VT is too large (that is, it is not in the range of the configured voltage VT), which indicates that the possibility that the signal line 20 becomes abnormal is high. At this moment, the micro control unit 82 may, for example, send an abnormal signal to the electronic controller 83, and the electronic controller 83 may, for example, generate a prompt message to notify the user, so that the user may immediately check whether the signal line 20 is abnormal, but it is not limited thereto. In this way, the electronic device 1 of the present disclosure may detect whether there is an abnormal detection line 20 in real time without waiting until the lighting stage, thereby avoiding waste of production cost, or the electronic device 1 may detect whether there is an abnormal detection line 20 in real time when it is in use. The electronic device 1 of the present disclosure may have different implementations. FIG. 5 is a schematic diagram of an electronic device 1 according to another embodiment of the present disclosure, and please refer to FIGS. 1 to 4 at the same time. The embodiment of FIG. 5 is generally applicable to the description of the embodiment of FIG. 1, and thus the following description will mainly focus on the differences.

In the embodiment of FIG. 5, the electronic device 1 may include a plurality of detection lines (the detection line 30 and the second detection line 31). For example, the electronic device 1 further includes a second detection line 31 and a second detection unit but it is not limited thereto. The second detection line 31 may be adjacent to the detection line 30; for example, the detection line 30 may be disposed between the second detection line 31 and the substrate edge 12. The second detection unit 40B and the detection unit 40 may be disposed on the circuit board 50, but it is not limited thereto. In one embodiment (not shown), the second detection unit 40B and the detection unit 40 may be disposed on different circuit boards. As mentioned above, the detection line 30 may be electrically connected to the connection lines on different components, so that the detection line 30 is electrically connected to the detection unit 40. Examples of connection lines on the aforementioned different components include the connection line on the conductive film 60, the connection line 70L on the flexible circuit board 70, the connection line 51L on the connector 51 and/or the connection line 50L on the circuit board 50, while it is not limited thereto.

Similarly, the second detection line 31 may also be electrically connected to the connection lines on different components, so that the second detection line 31 is electrically connected to the detection unit 40B. Examples of connection lines on the aforementioned different components include the connection line 61L on the conductive film 60, the connection line 71L on the flexible circuit board 70, the connection line 51L-1 on the connector 51 and/or the connection line 50L-1 on the circuit board 50, but it is not limited thereto.

In one embodiment, one end of the detection line 30 is electrically connected to the first external voltage VDD1 (which can be regarded as the external voltage VDD of the aforementioned embodiment), and the other end of the detection line 30 is electrically connected to a fixed voltage GND (low voltage or ground voltage). One end of the second detection line 31 is electrically connected to a second external voltage VDD2, and the other end of the second detection line 31 is electrically connected to a fixed voltage GND (low voltage or ground voltage). The voltage values of the first external voltage VDD1 and the second external voltage VDD2 may be the same or different. Similarly, the second detection unit 40B may be electrically connected to a second node n2, and a third external resistor R3 is provided between the second node 2 and the fixed voltage GND. The voltage difference between the second external voltage VDD2 and the fixed voltage GND is greater than zero. The resistance values of the first external resistor R1 and the third external resistor R3 may be the same or different. In one embodiment, the second detection line 31 is, for example, electrically connected to the second node n2. In one embodiment, the internal structure of the second detection unit 40B may be known from the description of the detection unit 40 (as shown in FIG. 4), and thus a detailed description is deemed unnecessary. The second detection unit 40B may detect the voltage V2 on the second node n2, and determine whether the second detection line 31 is abnormal or not according to whether the voltage V2 on the second node n2 is a normal value or not. The detailed detection method may be known with reference to the description of the aforementioned detection unit 40.

It is noted that, when the detection line 30 is abnormal and the signal line 20 is normal, the voltage V1 on the node n1 may be abnormal, which may cause the normal signal line 20 to be erroneously determined as abnormal. With the configuration of the second detection line 31 in the embodiment of FIG. 5, for example, the detection line 30 may be disposed between the second detection line 31 and the substrate edge 12, or the second detection line 31 may be disposed between the detection line 30 and the signal line 20. When the detection unit 40 determines that the detection line 30 is abnormal, but the second detection unit 40B determines that the second detection line 31 is not abnormal, the signal line 20 may be determined to be normal at this moment, so as to reduce the situation where the normal signal line 20 is erroneously determined.

Figure 6:
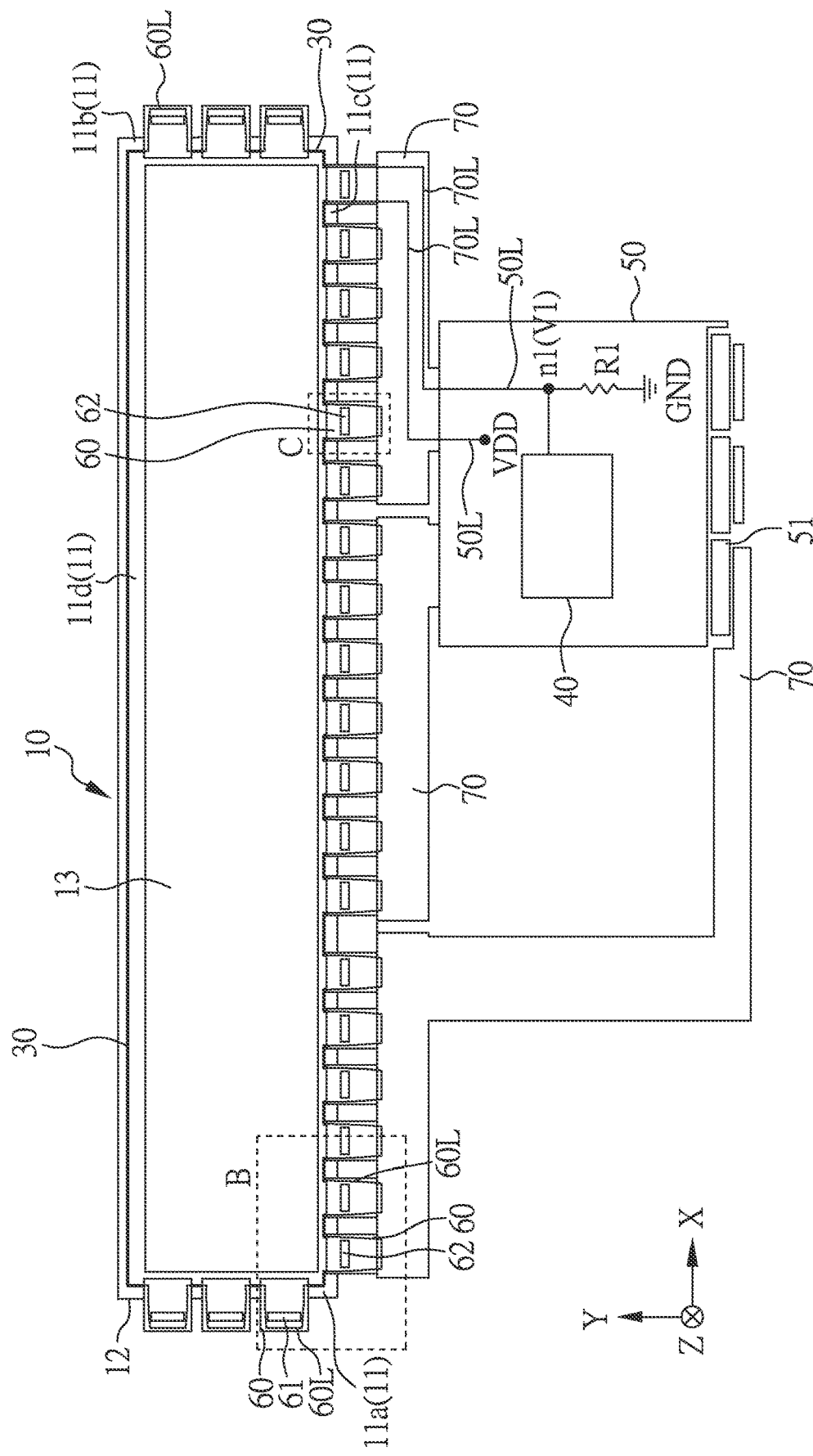
FIG. 6 is a schematic diagram of the electronic device according to another embodiment of the present disclosure.

The electronic device 1 of the present disclosure may have different implementations. FIG. 6 is a schematic diagram of an electronic device 1 according to another embodiment of the present disclosure, and please refer to FIG. 1 to FIG. 4 at the same time. The embodiment of FIG. 6 is generally applicable to description of the embodiment of FIG. 1, and thus the following description mainly focuses on the differences.

In the embodiment of FIG. 6, the detection line 30 not only extends in the first portion 11a, the fourth portion 11d and/or the second portion 11b of the peripheral area 11, but also extends in the third portion 11c of the peripheral area 11; that is, the detection line 30 is adjacent to the signal line 20 near the scan driver 61, the signal line 20 near the data driver 62, and/or the signal line 20 on the fourth portion 11d. Since the detection line extending in the first portion 11a, the fourth portion 11d and/or the second portion 11b of the peripheral area 11 can be known from the description of the embodiment in FIG. 1, it is not described in detail, and the following description mainly focuses on the detection line 30 near the data driver 62.

Figure 7:
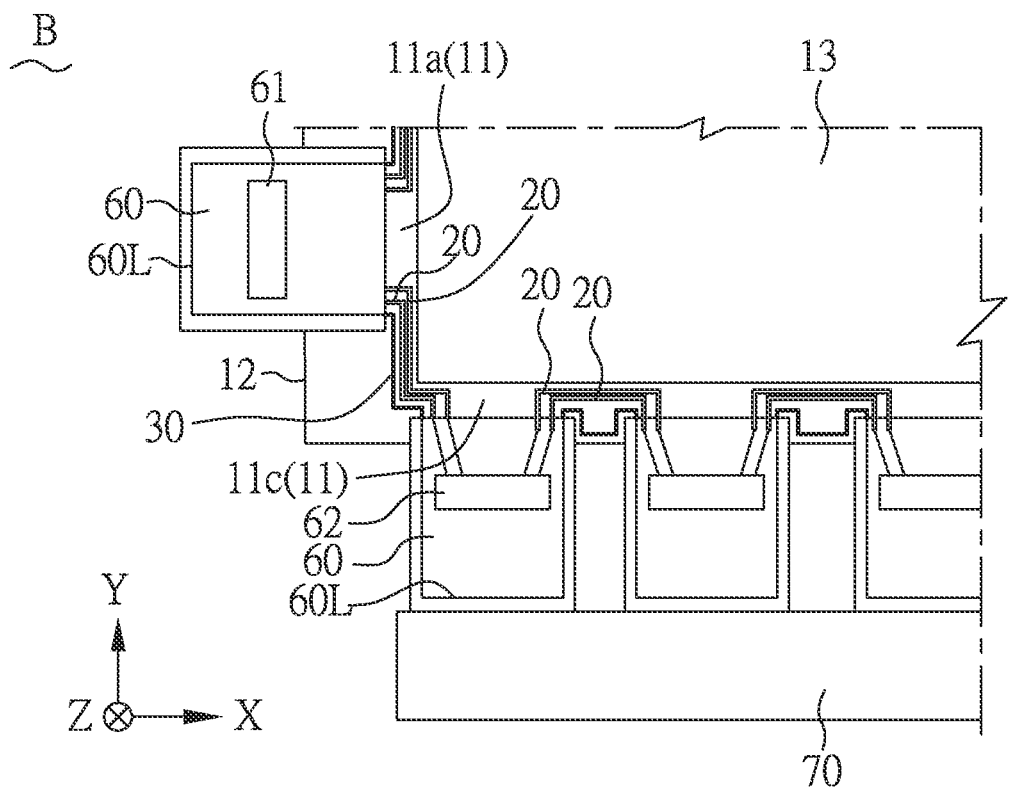
FIG. 7 is an enlarged view illustrating the area B of FIG. 6 according to an embodiment of the present disclosure.

FIG. 7 is an enlarged view of the area B in FIG. 6 according to an embodiment of the present disclosure, and please refer to FIG. 1 to FIG. 6 at the same time.

As shown in FIG. 7, different data drivers 62 may be electrically connected to each other through the signal line 20, and the detection line 30 may be disposed between the substrate edge 12 and the signal line 20. In addition, the connection line 60L electrically connected to the detection line 30 may be disposed on the conductive film 60 where the data driver 62 is disposed, and the connection line 60L on a different conductive film 60 is connected to data line not through the data driver 62, for example.

In this way, through the aforementioned design of the electrical connection path of the detection line 30 and the detection unit 40, the electronic device 1 may detect whether the signal line 20 between the data drivers 62 is abnormal or not in real time.

Figure 8:
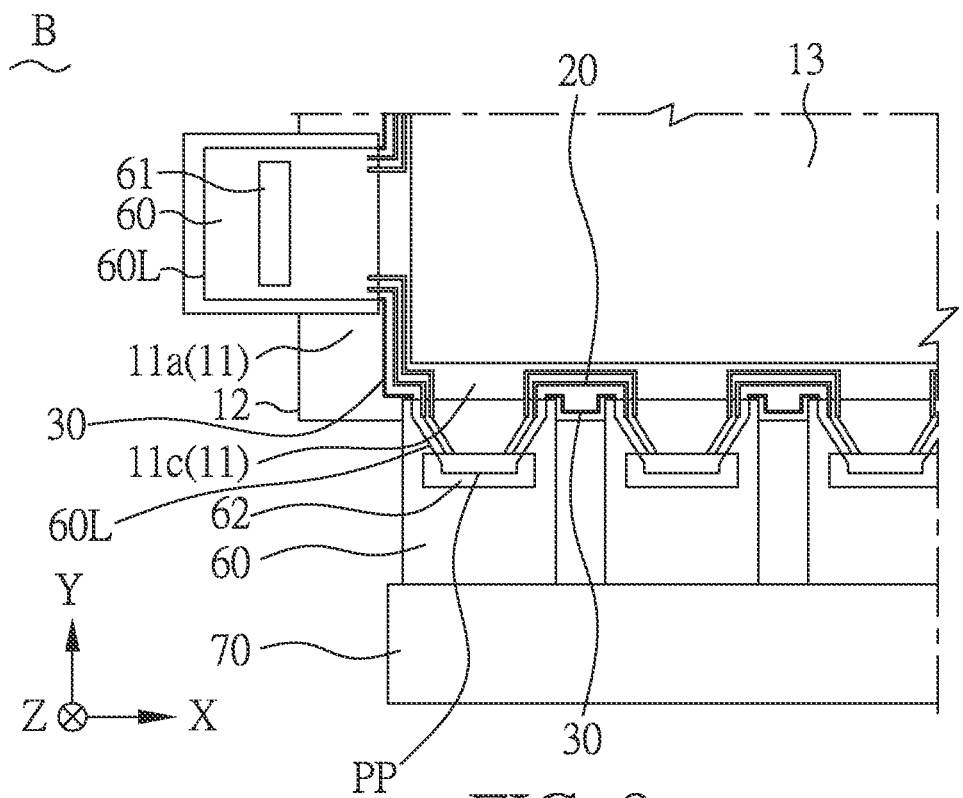
FIG. 8 is an enlarged view illustrating the area B of FIG. 6 according to another embodiment of the present disclosure.

FIG. 8 is an enlarged view of the area B of FIG. 6 according to another embodiment of the present disclosure, and please refer to FIG. 1 to FIG. 7 at the same time.

As shown in FIG. 8, the different data drivers 62 may be electrically connected to each other through the signal line 20, and the detection line 30 may be disposed between the substrate edge 12 and the signal line 20. The connection lines 60L on different conductive films 60 may be electrically connected via the data driver 62. For example, in addition to the wiring paths related to the driving data lines, the data driver 6 also has a branch path PP that is electrically insulated from the wiring paths related to the driving data lines, so that the connection line 60L may be electrically connected to the branch path PP to form a loop with other detection lines 30, but it is not limited thereto.

It is noted that, as can be inferred from FIG. 8, if the scan driver 61 has a branch path PP (not shown) electrically insulated from the wiring path related to the driving scan line, the connection line 60L may be electrically connected to the branch path PP (not shown) inside the scan driver 61.

As a result, the electronic device 1 may detect in real time whether the signal line between the data drivers 62 is abnormal or not.

Figure 9:
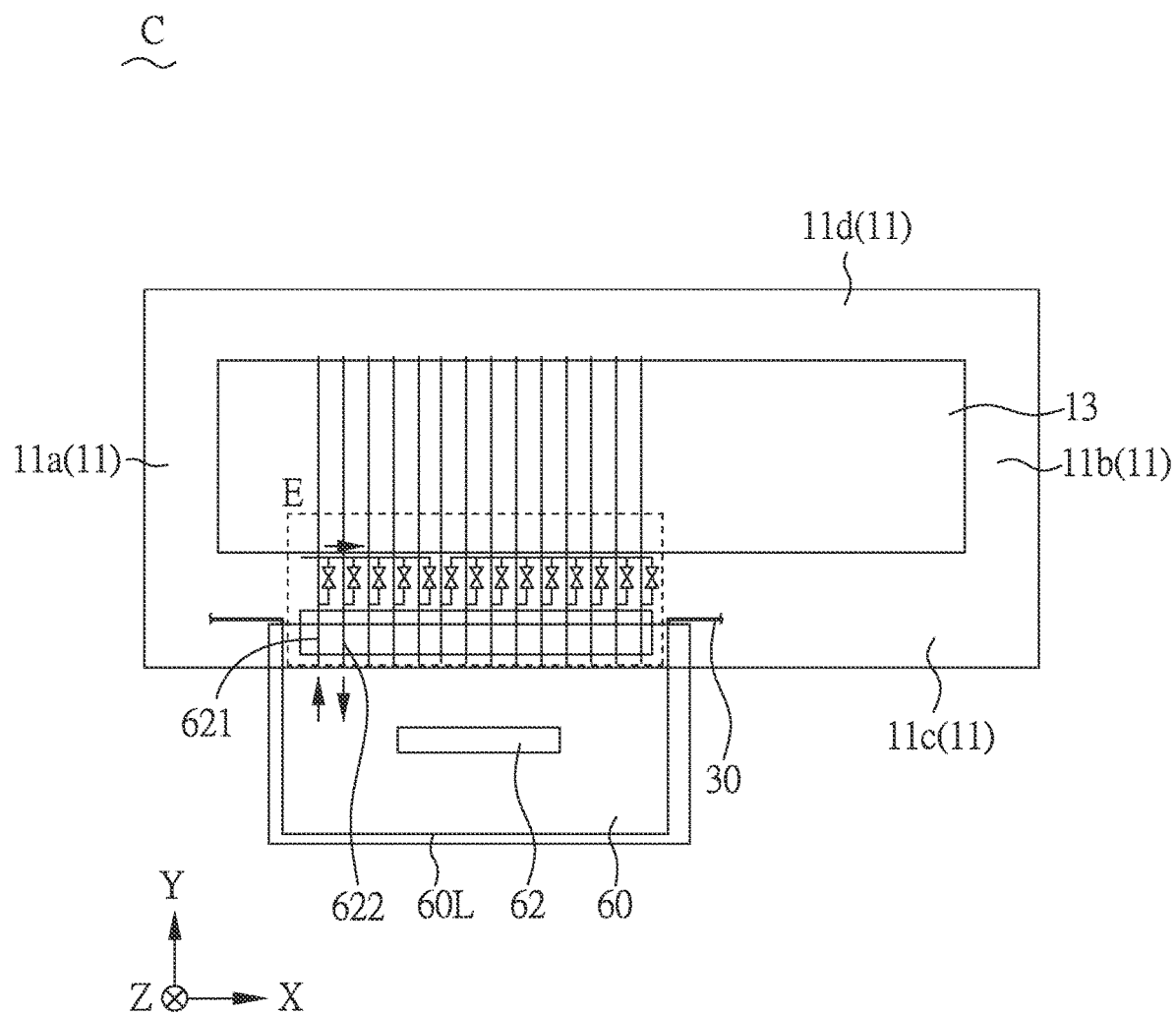
FIG. 9 is an enlarged view illustrating the area C of FIG. 6 according to an embodiment of the present disclosure.

FIG. 9 is an enlarged view of area C of FIG. 6 according to an embodiment of the present disclosure, and please refer to FIG. 1 to FIG. 7 at the same time.

As shown in FIG. 9, part of the third portion 11c of the peripheral area 11 belongs to the bonding area E, and part of the conductive film 60 is arranged and bonded on the bonding area E. Since the bonding area E is provided with a plurality of conductive lines, the bonding area E has no extra space for being configured with the detection line 30, so that, when the circuit (signal line) in the bonding area E is damaged, the aforementioned method of determining the damage of the circuit (signal line) through the detection line cannot detect anomalies in bonding area E. In one embodiment, the data driver 62 may have a leakage current detection mechanism, a first signal line 621 of the conductive film in the bonding area E may be used to input a detection signal, and a second signal line 622 of the conductive film 60 in the bonding area E may be used to output the detection signal. When the signal line corresponding to the bonding area E is abnormal (for example, damaged or broken), the data driver 62 may not, for example, detect the current leakage. In this way, it can be known whether there is any circuit (signal line) damage in the bonding area E. In one embodiment (not shown), if the scan driver 61 may be optionally provided with a leakage current detection mechanism similar to the above, it can also detect the part of the conductive film 60 which is bonded to the substrate and the scan driver 61 is disposed on is abnormal or not through the aforementioned method, but it is not limited thereto.

As a result, the electronic device 1 may detect whether the signal line 20 in the bonding area E is abnormal or not in real time.

Figure 10:
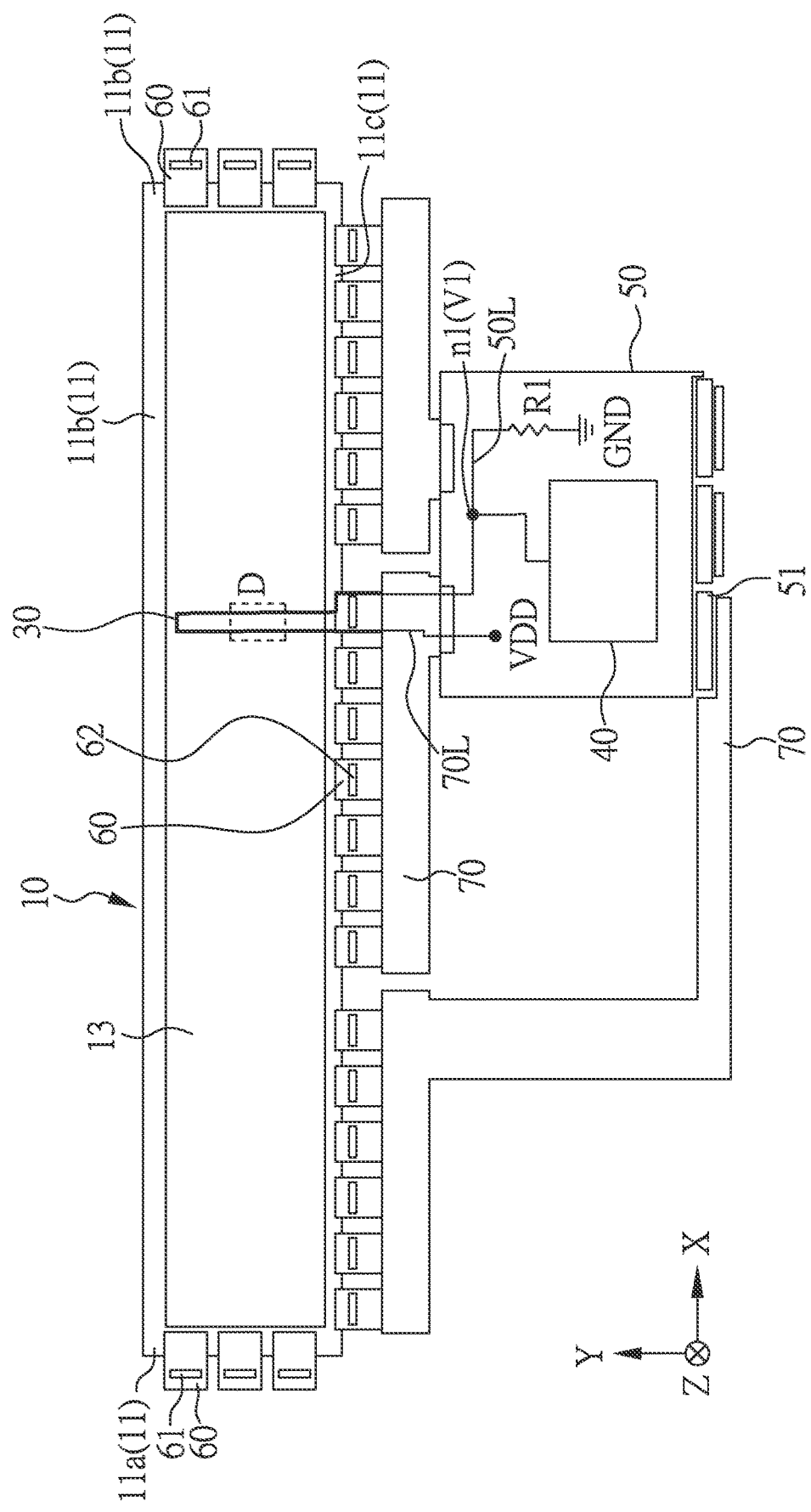
FIG. 10 is a schematic diagram of the electronic device according to another embodiment of the present disclosure.
Figure 11:
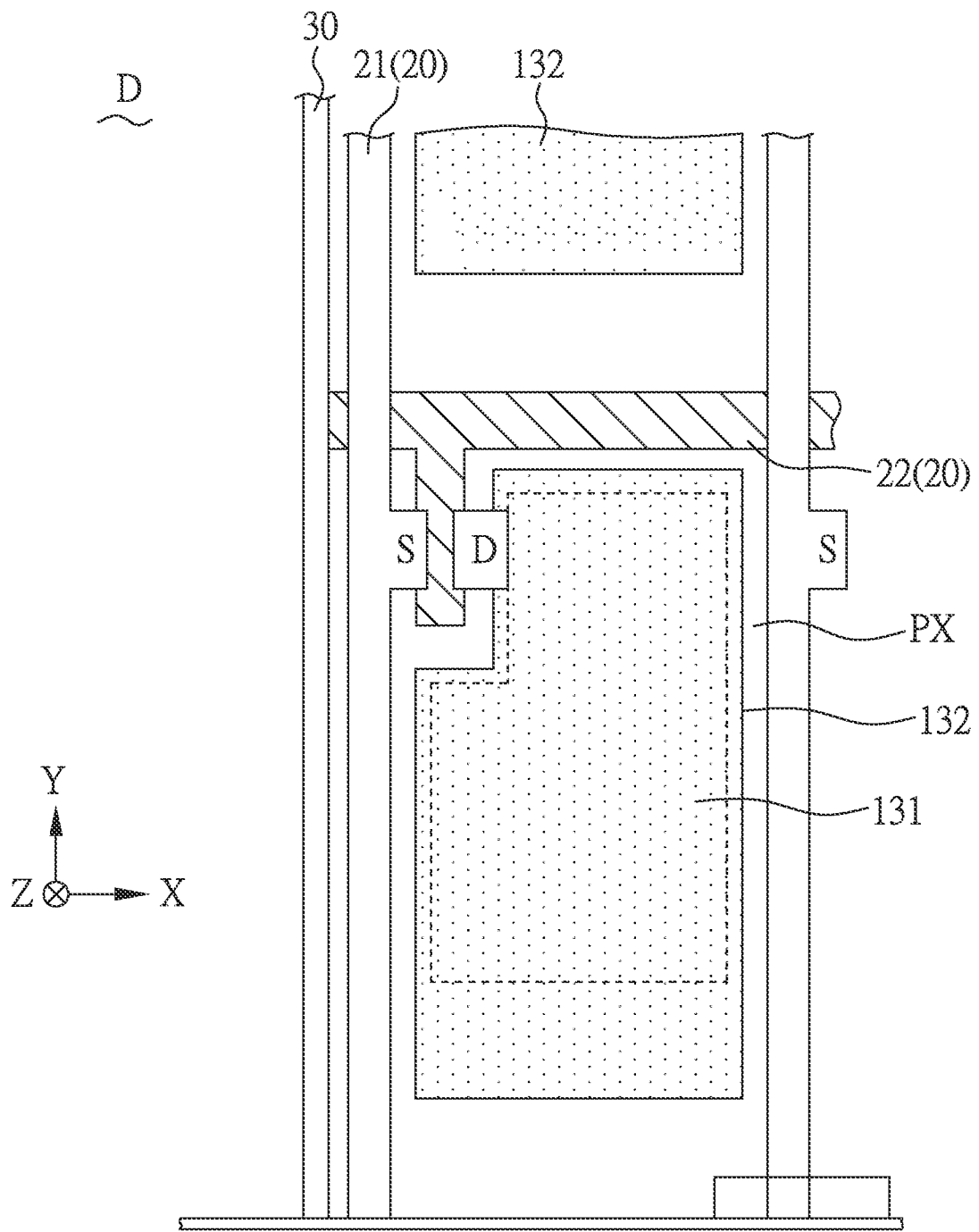
FIG. 11 is an enlarged view illustrating the area D of FIG. 10 according to an embodiment of the present disclosure.

The electronic device 1 of the present disclosure may have different implementations. FIG. 10 is a schematic diagram of an electronic device 1 according to another embodiment of the present disclosure, FIG. 11 is an enlarged view of the area D of FIG. 10 according to an embodiment of the present disclosure, and please refer to FIG. 1 to FIG. 9 at the same time. The embodiment of FIG. 10 is generally applicable to the description of the embodiment of FIG. 1, and thus the following description will mainly focus on the differences.

In the embodiment of FIG. 10, the substrate 10 has an active area 13 and a peripheral area 11 adjacent to the active area 13, the signal line 20 is arranged on the substrate 10 and disposed in the active area 13, and the detection line 30 is arranged on the substrate 10 and disposed in the peripheral area 11 and the active area 13. The detection line 30 is adjacent to the signal line 20, and the detection line 30 is electrically insulated from the signal line 20 (with reference to FIG. 11).

In the embodiment of FIG. 10, the detection line 30 of the active area 13 on the substrate 10 is connected with the connection line 50L on the circuit board 50, the connection line 70L on the flexible circuit board 70 and the connection line 60L on the conductive film 60 for being further electrically to the detection unit 40 so as to forms a loop, wherein the detection line 30 is electrically insulated from the data driver 62 on the conductive film 60, for example, but it is not limited thereto. As shown in FIG. 11, in the active area 13, the detection line 30 may be adjacent to the data line 21 and electrically insulated from the data line 21, wherein the data line 21 and the scanning line 22 may be electrically connected to a plurality of pixel units PX, and each pixel unit PX includes, for example, a gate electrode D, a source electrode S, a first conductive electrode 131 (e.g., a pixel electrode), and a second conductive electrode 132 (e.g., a common electrode), while it is not limited thereto. FIG. 10 exemplifies that the signal line 20 adjacent to the detection line 30 is a data line 21, but it is not limited thereto. In other embodiments (not shown), the detection line 30 is adjacent to and electrically insulated from the signal line 20 in the active area 13, and the signal line 20 may also be the scan line 22 or other signal lines.

In the aforementioned embodiment of FIG. 10 and FIG. 11, similar to the embodiment of FIG. 4, when the detection unit 40 of this embodiment detects that the detection line 30 is abnormal, the micro control unit 82 may, for example, transmit an abnormal message to the electronic control unit 83. In one embodiment, when the detection line 30 or the signal line 20 may become abnormal, the electronic control unit 83 may, for example, turn off the operation of the pixel unit PX (or detection unit) in the active area 13, so that the electronic device 1 stops the operation of the active area. 13, but it is not limited thereto.

As a result, the abnormal signal line 20 (such as the data line 21, but not limited thereto) disposed in the active area 13 may also be detected by the electronic device 1 in real time.

From FIG. 10 and FIG. 11, it can be known that the detection line 30 in the active area 13 may also be arranged adjacent to the scan lines 22 (or other type of signal line). In one embodiment, in a top view direction (e.g., Z direction), the detection line 30 and the signal line 20 in the active area 13 may be disposed in the same conductive layer, or in different conductive layers, while it is not limited thereto. In one embodiment, when the detection line 30 and the signal line 20 in the active area 13 are disposed in different conductive layers, they may at least partially overlap or not overlap in a top view direction. In one embodiment, when the detection line 30 and the signal line 20 in the active area 13 are disposed on the same conductive layer, the two do not overlap in the top view direction, and the detection line 30 and the signal line 20 need to be spaced apart by a gap, so as to electrically insulate the detection line 30 and the signal line 20 from each other. In one embodiment, in the top view direction (Z), the conductive layer on which the detection line 30 is formed may be disposed below or above the conductive layer on which the signal line 20 is formed, but it is not limited thereto.

With reference to FIG. 10, similarly, the electronic device 1 includes a circuit board 50 electrically connected to the substrate 10, and the detection unit 40 is arranged on the circuit board 50. Similarly, one end of the detection line 30 is electrically connected to an external voltage VDD, the other end of the detection line 30 is electrically connected to a fixed voltage GND, and the voltage difference between the external voltage VDD and the fixed voltage GND is greater than 0, wherein the detection unit 40 is electrically connected to the node n1, and an external resistor R1 is electrically connected between the fixed voltage GND and the node n1. The detection line 30 is electrically connected to the node n1. Similarly (refer to FIG. 4), the detection unit 40 includes a comparator 41, one end 41a of the comparator 41 is electrically connected to the detection line 30, the other end 41b of the comparator 41 is electrically connected to a register 81, and the register 81 is provided to store a configured voltage VT. Similarly (refer to FIG. 4), one end of the comparator 41 may be electrically connected to the micro control unit 82, but it is not limited thereto. The micro control unit 82 may be electrically connected to an electronic control unit (ECU) 83, but it is not limited thereto.

Figure 12:
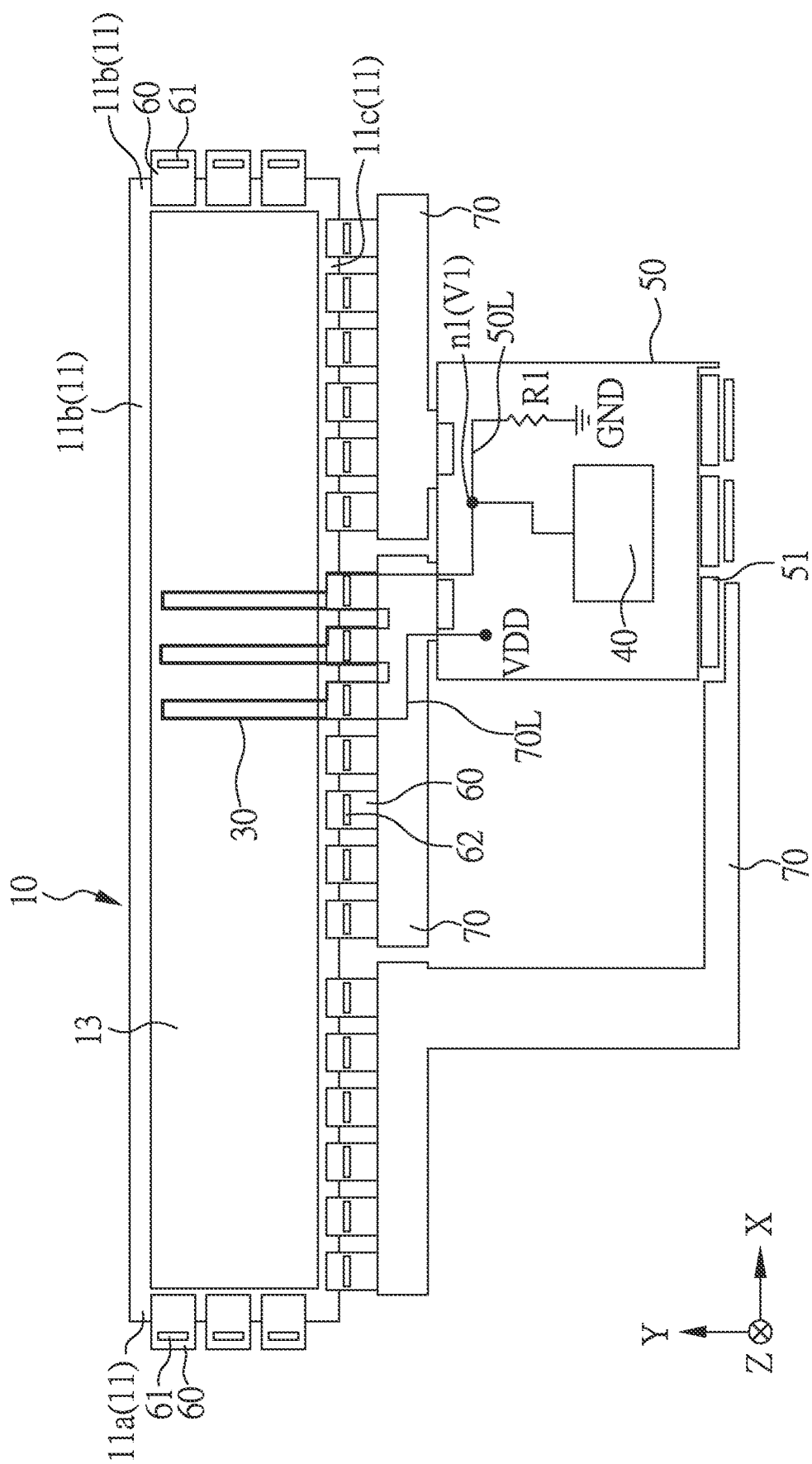
FIG. 12 is a schematic diagram of the electronic device according to another embodiment of the present disclosure.

The electronic device 1 of the present disclosure may have different implementations. FIG. 12 is a schematic diagram of an electronic device 1 according to another embodiment of the present disclosure, and please refer to FIG. 1 to FIG. 11 at the same time. The embodiment of FIG. 12 is generally applicable to the description of the embodiment of FIG. 10, and thus the following description mainly focuses on the differences.

In the embodiment of FIG. 12, the extension path of the detection line 30 may be adjusted according to the requirements, and the detection line 30 may be disposed on the circuit board 50, the flexible circuit board 70, a plurality of conductive films 60 and/or the active area 13 to form a loop, whereby the detection line 13 may be adjacent to a plurality of signal lines 20 (such as data lines 21, but not limited thereto) in the active area 13 and electrically insulated from the plurality of signal lines 20.

It is noted that the detection line 30 in all embodiments and the connection lines on different components, such as the aforementioned connection line 60L, connection line 70L, connection line 51L and/or connection line 50L, may be conductive layers of the same or different materials.

Figure 13:
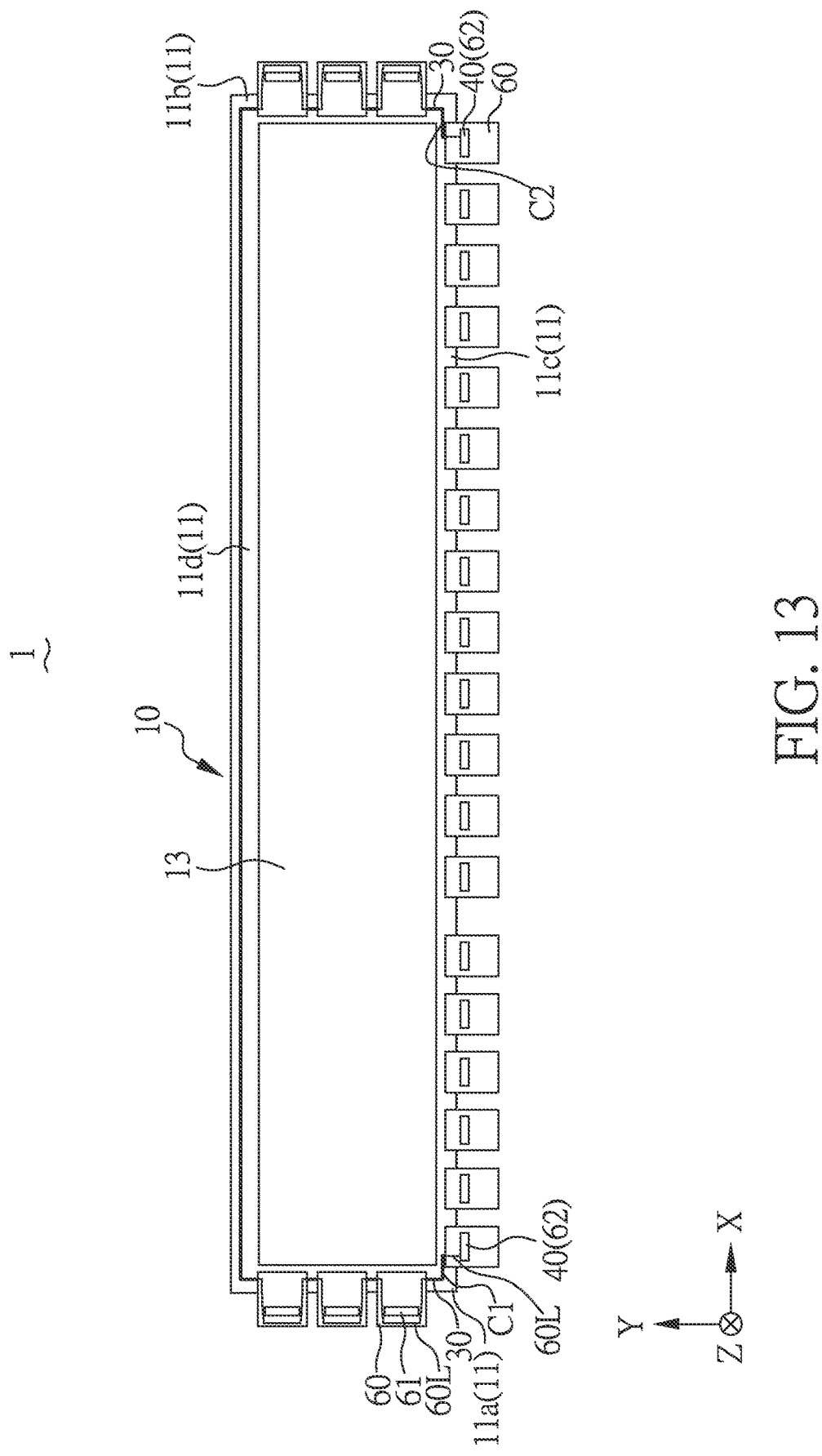
FIG. 13 is a schematic diagram of the electronic device according to another embodiment of the present disclosure.

The electronic device 1 of the present disclosure may have different implementations. FIG. 13 is a schematic diagram of an electronic device 1 according to another embodiment of the present disclosure, and please refer to FIG. 1 to FIG. 12 at the same time. The embodiment of FIG. 13 is generally applicable to the description of the embodiment of FIG. 1, and thus the following description mainly focuses on the differences.

In the embodiment of FIG. 13, the detection unit 40 may be arranged inside the data driver 62, but it is not limited thereto. As shown in FIG. 13, one end C1 of the detection line 30 is electrically connected to one of the data drivers 62, and the one of the data drivers 62 may, for example, provide a signal to the detection line 30. In addition, the other end C2 of the detection line 30 is electrically connected to another data driver 62, and the detection unit 40 may be arranged inside the another data driver 62 and electrically connected to the detection line 30 to receive signal of the wiring path passing the detection line 30.

In one embodiment, after the signal passes the wiring path of the detection line, the detection unit 40 detects the voltage change, waveform (such as pulse waveform) change or other signal change parameters of the signal, so that the electronic device 1 may determine whether the signal line 20 is abnormal or not, but it is not limited thereto.

In the aforementioned embodiments, in the top view direction (Z), the detection line 30 may be covered by a protective layer, and the protective layer may be, for example, a glass cover, a seal frame, etc., while it is not limited thereto.

The present disclosure may immediately detect whether the signal line is abnormal or not after cutting or during operation, and thus can solve the problems of the prior art.

The details or features of the various embodiments disclosed in the present disclosure may be mixed and matched arbitrarily as long as they do not violate or conflict the spirit of the invention.

The aforementioned specific embodiments should be construed as merely illustrative, and not limiting the rest of the present disclosure in any way.

The invention claimed is:

1. An electronic device, comprising:
   a substrate having a peripheral area and a substrate edge;
   a signal line arranged on the substrate and disposed in the peripheral area;
   a detection line arranged on the substrate and adjacent to the signal line; and
   a detection unit electrically connected to the detection line,
   wherein the detection line is disposed between the signal line and the substrate edge, and the detection line is electrically insulated from the signal line;
   wherein the detection line has one end electrically connected to an external voltage, and the other end electrically connected to a fixed voltage, and a voltage difference between the external voltage and the fixed voltage is greater than zero.

2. The electronic device as claimed in claim 1, further comprising a circuit board electrically connected to the substrate, wherein the detection unit is arranged on the circuit board.

3. The electronic device as claimed in claim 1, wherein the detection unit is electrically connected to a node, and an external resistor is electrically connected between the fixed voltage and the node.

4. The electronic device as claimed in claim 3, wherein the external voltage is electrically connected to the detection line via a second external resistor.

5. The electronic device as claimed in claim 1, wherein the detection unit includes a comparator having one end electrically connected to the detection line, and the other end electrically connected to a register which stores a configured voltage.

6. The electronic device as claimed in claim 1, wherein, in a width direction parallel to the detection line, the detection line and the substrate edge are separated by a first distance, and the signal line and the substrate edge are separated by a second distance, where the first distance is greater than or equal to 50 microns and smaller than the second distance.

7. The electronic device as claimed in claim 1, wherein the substrate further comprises an active area, and the peripheral area surrounds the active area.

8. The electronic device as claimed in claim 7, wherein the peripheral area has a first portion, a second portion, a third portion and a fourth portion, the first portion is opposite to the second portion, the third portion is opposite to the fourth portion, and the first portion and the second portion are each connected between the third portion and the fourth portion.

9. The electronic device as claimed in claim 8, wherein the detection line extends in the first portion, the fourth portion and the second portion of the peripheral area.

10. The electronic device as claimed in claim 8, wherein the detection line extends in the first portion, the fourth portion, the second portion and the third portion of the peripheral area.

11. The electronic device as claimed in claim 1, wherein the detection line is electrically connected to connection lines on different components, so that the detection line is electrically connected to the detection unit.

12. An electronic device, comprising:
a substrate having a peripheral area and a substrate edge;
a signal line arranged on the substrate and disposed in the peripheral area;
a detection line arranged on the substrate and adjacent to the signal line; and
a detection unit electrically connected to the detection line,
wherein the detection line is disposed between the signal line and the substrate edge, and the detection line is electrically insulated from the signal line;
wherein the electronic device further comprises a second detection line and a second detection unit, the second detection line is adjacent to the detection line, the second detection line is electrically connected to connection lines on different components, so that the second detecting line is electrically connected to the second detecting unit;
wherein the second detection line has one end electrically connected to a second external voltage, and the other end electrically connected to a fixed voltage, and a voltage difference between the second external voltage and the fixed voltage is greater than zero.

13. The electronic device as claimed in claim 12, wherein the second detection unit is electrically connected to a second node, and a third external resistor is provided between the second node and the fixed voltage.

14. The electronic device as claimed in claim 12, wherein the detection line is disposed between the second detection line and the substrate edge, or the second detection line is disposed between the detection line and the signal line.

15. An electronic device, comprising:
a substrate having an active area and a peripheral area adjacent to the active area;
a signal line arranged on the substrate and disposed in the active area;
a detection line arranged on the substrate and disposed in the peripheral area and the active area; and
a detection unit electrically connected to the detection line,
wherein the detection line is adjacent to the signal line, and the detection line is electrically insulated from the signal line;
wherein the detection unit includes a comparator having one end electrically connected to the detection line and the other end electrically connected to a register, and the register stores a configured voltage.

16. The electronic device as claimed in claim 15, further comprising a circuit board electrically connected to the substrate, wherein the detection unit is arranged on the circuit board.

17. The electronic device as claimed in claim 15, wherein the detection line has one end electrically connected to an external voltage, and the other end electrically connected to a fixed voltage, and a voltage difference between the external voltage and the fixed voltage is greater than zero, in which the detection unit is electrically connected to a node, and an external resistor is electrically connected between the fixed voltage and the node.

* * * * *